United States Patent [19]

Hsue et al.

[11] Patent Number: 5,668,031
[45] Date of Patent: Sep. 16, 1997

[54] METHOD OF FABRICATING HIGH DENSITY FLAT CELL MASK ROM

[75] Inventors: Chen-Chiu Hsue, Hsinchu; Cheng-Hui Chung, Hsinchu Hsien; Yi-Chung Sheng, Taichung, all of Taiwan

[73] Assignee: United Microelectronics Corp., Taiwan, China

[21] Appl. No.: 658,673

[22] Filed: Jun. 4, 1996

[30] Foreign Application Priority Data

Apr. 13, 1996 [TW] Taiwan ............... 85104415

[51] Int. Cl.$^6$ ............... H01L 21/70
[52] U.S. Cl. ............... 438/275
[58] Field of Search ............... 437/48, 45, 52; 156/643.1

[56] References Cited

U.S. PATENT DOCUMENTS

| | | | |
|---|---|---|---|
| 5,180,680 | 1/1993 | Yang | 437/38 |
| 5,460,987 | 10/1995 | Wen et al. | 437/40 |
| 5,504,025 | 4/1996 | Fong-Chun et al. | 437/48 |

*Primary Examiner*—John Niebling
*Assistant Examiner*—Joni Y. Chang
*Attorney, Agent, or Firm*—Spencer & Frank

[57] ABSTRACT

A method of fabricating a high density flat mask read only memory. At first a plurality of trenches are formed in a surface of a silicon substrate at predetermined desired source-drain electrodes areas. A dielectric layer is formed on at least the surface of the trenches. A first polysilicon layer is formed over the dielectric layer and then portions of the first polysilicon layer are removed to leave a portion thereof on the bottom of each trench. Using the first polysilicon layer as an etch stop layer, the dielectric layer is etched. A second polysilicon layer then is formed on the surface of the silicon substrate, the first polysilicon layer and the dielectric layer, and then the the second polysilicon layer is etched back to the substrate surface to form the source-drain electrode areas, that is, the bit lines. On the surface of the bit lines and the silicon substrate, a gate oxide layer and a third polysilicon layer are formed sequentially. Finally, the gate oxide layer and the third polysilicon layer are defined to form gate electrodes, that is, word lines for the memory.

5 Claims, 4 Drawing Sheets

METHOD OF FABRICATING HIGH DENSITY FLAT CELL MASK ROM

BACKGROUND OF THE INVENTION

1. Field of the Invention

The prevent invention generally relates to a method of fabricating an integrated circuit (IC) and more particularly to a method of fabricating a high density flat cell mask read only memory (ROM) using the trench technique to resolve the problem of cell punch-through.

2. Description of Related Art

Memory devices are widely used in different kind of information hardware. Since hardware has become lighter, thinner, shorter and smaller, high density and small and fast memory is required. Of the different kinds of memory, a ROM is a permanent memory, which is used in digital equipment, such as mini computer systems, micro computer systems, to store permanent programs of these systems. The production process of a ROM is very complicated including many steps. Each step spends time in material processing and factor control. Because most ROMs have the same basic structure except for information stored in programming, in most IC factories, a half product (partially completed product) of a mask ROM is produced without performing programming and is stocked. After receiving an order for a special program from customer, a mask is produced to perform the programming and to finish production, so that the lead time can be reduced to provide better service for customers. Therefore, a post programmed mask ROM is commonly used in the art.

Currently, the mask read only memory with buried bit lines is one of the most popular mask ROMs due to its small dimensions and high density. FIG. 1 is a top-view diagram illustrating part of traditional flat mask ROM wherein source-drain electrode areas 10 are buried bit lines, and polysilicon gates 11 are word lines. The area marked with numeral 12 is a memory cell. FIG. 2 is a schematic cross-sectional diagram illustrating the cross-section along the direction of line II—II in FIG. 1, wherein numeral 20 indicates a silicon substrate and the numeral 21 indicates a gate oxide layer. The buried bit lines 10 are formed by implantation. After the bit lines 10 are formed, there are may processes to be performed to complete the whole integrated circuit. That is, the wafers will undergo several high temperature processes. Each high temperature process could cause the diffusion of impurities in area such as the buried bit lines 10, so that the space s between two adjacent buried bit lines 10 will become narrow. For example, in FIG. 2, the space s between two adjacent source-drain electrode areas 10 becomes narrow which induces cell punch-through.

As the need of high density of memory is stronger than ever, the most efficient method to increase the density of a high density flat memory with buried bit lines is to diminish the dimensions of each memory cell. That is, to diminish the space between the source electrode and the drain electrode of a memory cell. In this way, the punch-through problem between two impurity areas will become more and more serious.

SUMMARY OF THE INVENTION

It is therefore an object of the present invention to provide a method of fabricating a flat cell mask ROM with buried bit lines, using polysilicon buried bit lines, whereby punch through will not occur between adjacent bit lines after later processes.

The present invention achieves the above-identified object by providing a method of fabricating high density flat mask read only memory wherein, at first, a plurality of trenches are formed on predetermined source-drain electrodes areas oa a silicon substrate. A dielectric layer is formed on the surface of the trenches. A first polysilicon layer is formed and then portions of the first polysilicon layer are removed. Using the first polysilicon layer as an etch stop layer, the dielectric layer is etched. On the surface of the silicon substrate, the first polysilicon layer and the dielectric layer, a second polysilicon layer is formed. The second polysilicon layer is etched to form the source-drain electrode areas, that is, the bit lines. On the surface of the bit lines and the silicon substrate, a gate oxide layer and a third polysilicon layer are formed separately. Finally, the gate oxide layer and the third polysilicon layer are defined to form a gate electrode, that is, the word line.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1:
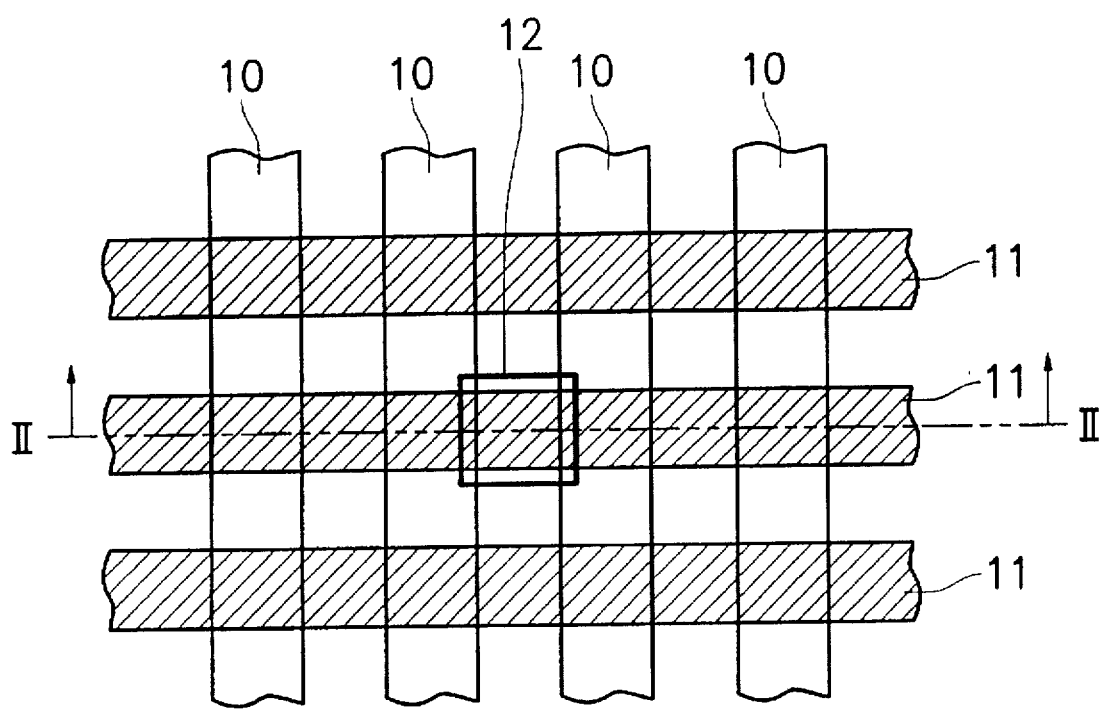
FIG. 1 is a schematic top-view illustrating the traditional structure of a mask ROM with buried bit lines.
Figure 2:
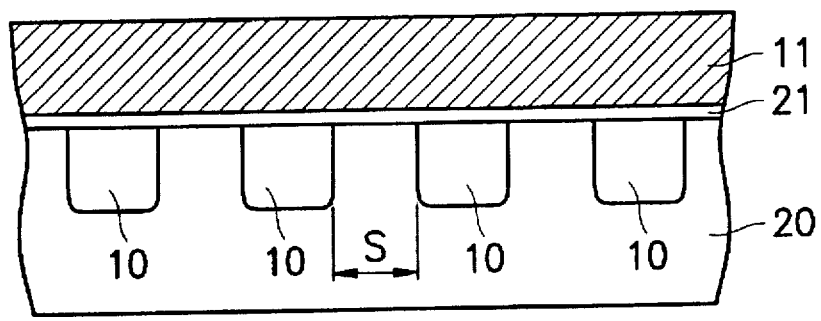
FIG. 2 is a schematic cross-sectional diagram illustrating the cross-section along the II—II line in FIG. 1.
Figure 3A:
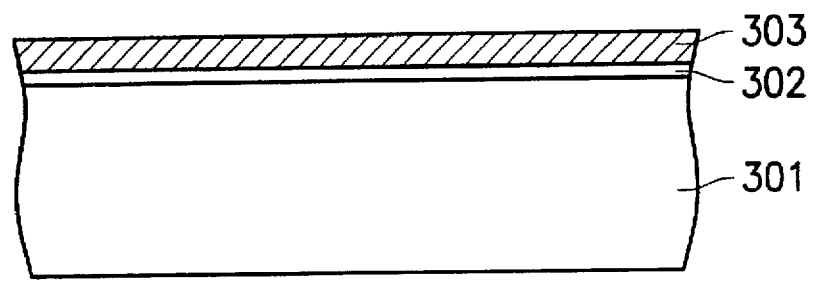
FIGS. 3A through 3I are cross-sectional diagrams illustrating the various steps in the production of a high density flat cell mask ROM a preferred embodiment of the method according to the present invention.

As shown in FIG. 3A, a silicon substrate 301 is provided. Then, an oxide layer 302 is formed on the silicon substrate 301. Thereafter, a silicon nitride layer 303 is deposited on the oxide layer 302 by, e.g., plasma enhanced chemical vapor deposition.

Figure 3B:
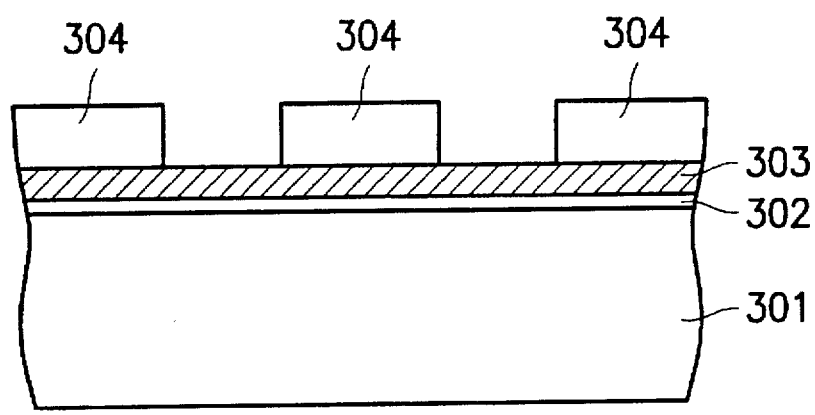

As shown in FIG. 3B, the surface of the silicon nitride layer 303 is coated with a photoresist layer 304 which is subsequently masked and exposed, and structure in a conventional manner, to define the predetermined source-drain electrode areas; that is, the bit line areas are defined.

Figure 3C:
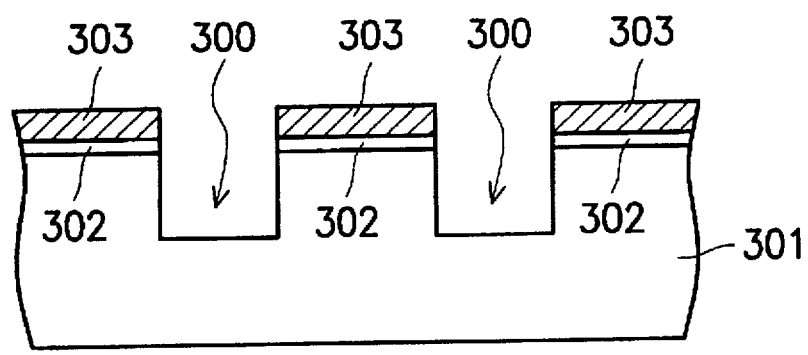

In FIG. 3C, using the structured photoresist layer 304 as a mask, a plurality of trenches 300 with a depth of between 0.2 μm to 0.4 μm are formed in the silicon substrate 301 by using, e.g. dry etching, on the predetermined position where bit line areas will be formed. Thereafter, the photoresist layer 304 is removed.

Figure 3D:
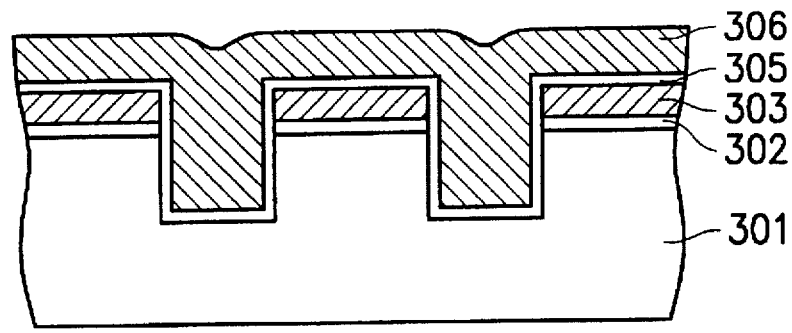

As shown in FIG. 3D, a dielectric layer 305 then is deposited on the surface of the substrate and particularly on the surface of the trenches 300. In the preferred embodiment, the dielectric layer 305 is an oxide layer. Consequently, at this time, as shown, the silicon nitride layer 303 likewise is covered by the dielectric layer 305. A first polysilicon layer 306 then is deposited on the entire surface of the dielectric layer 305 and, as shown, fills the trenches 300. For example, the polysilicon layer 306 can be deposited using low pressure chemical vapor deposition by heating and decomposing silane ($SiH_4$).

Figure 3E:
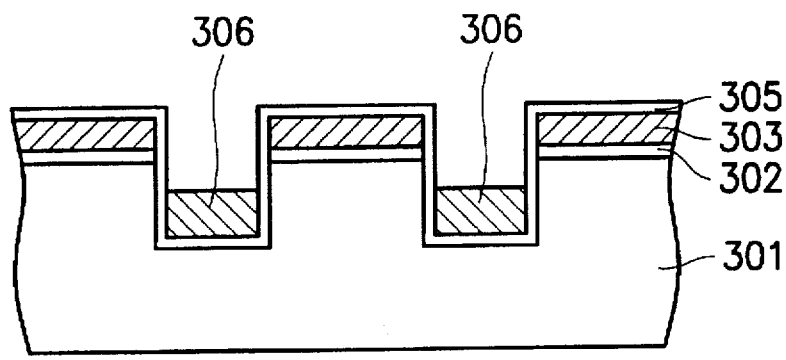

Thereafter, part of the first polysilicon layer 306 is removed by etching back in a conventional manner so that only a portion of the polysilicon layer 306 with a thickness of about 1000 Å remains in each of the trenches as shown in FIG. 3E.

Figure 3F:
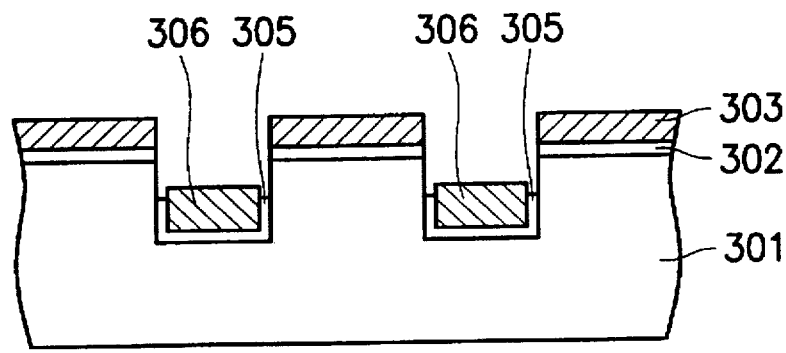

Then, as shown in FIG. 3F, the dielectric layer 305 is removed, by etching with hydrofluoric acid (HF), from the surface of the layer 303 and from the side walls of the trenches, down to essentially the level of the remaining portions of the polysilicon layer 306 using the polysilicon layer 306 as an etch stop layer.

Figure 3G:
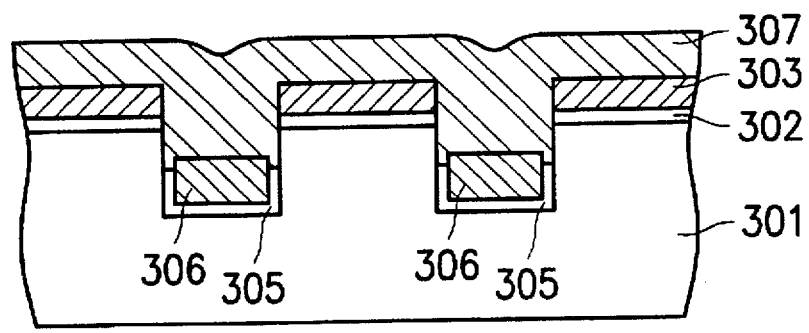

As can be seen in FIG. 3G, a second polysilicon layer 307 then is deposited on the exposed surface of the first polysilicon layer 306 and of the dielectric layer 305. At this time, the second polysilicon layer 307 additionally covers the silicon nitride layer 303.

Figure 3H:
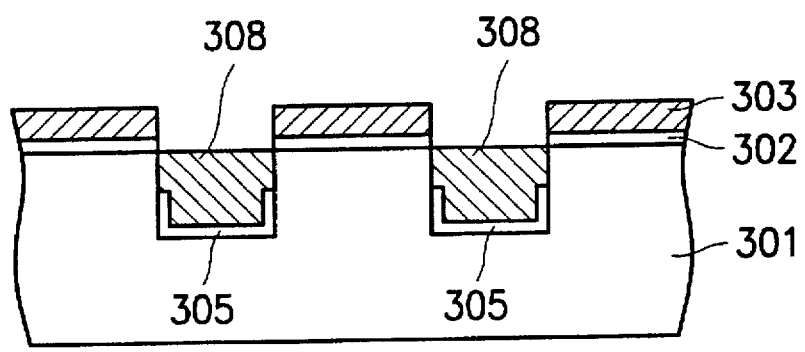

As shown in FIG. 3H, the second polysilicon layer 307 is then etched back to have the same height as the surface of the silicon substrate 301 and thus form the source-drain electrode areas 308 for memory cells. Thus the source-drain electrode areas 308 are formed by portions of the first polysilicon layer 306 and of the second polysilicon layer 307, therefore completing the formation of the buried bit lines for the memory. Then, the silicon nitride layer 303 and the oxide layer 302 are removed. For example, the silicon nitride layer 303 is removed by heated phosphoric acid and the oxide layer 302 is removed by etching with hydrofluoric acid.

Figure 3I:
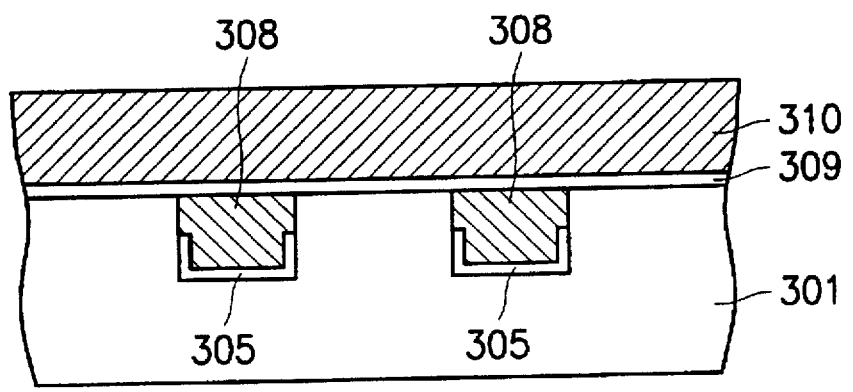

After the removal of the layers 303 and 302, as shown in FIG. 3I, a gate oxide layer 309 then is deposited on the surface of the silicon substrate 301 and the source-drain electrode areas 308, and a further polysilicon layer 310 is deposited on the gate oxide layer 309. Finally, using conventional photolithography technology, the polysilicon layer 310 and gate oxide layer 309 are defined or structured to form the designed gate electrodes, and thus to complete the formation of the word lines of the memory. Thereafter, the memory matrix is programmed in a known manner to finish the fabrication of the high density flat cell mask ROM.

As will be understood by those who are skilled in this art, the present invention has the following several merits:

(a) A dielectric layer (305) is formed, at least partially, between the source-drain electrodes areas (308) and the silicon substrate (301) to isolate the source-drain electrodes area and the silicon substrate, thereby reducing leakage current.

(b) The distance between adjacent source-drain electrode areas (308) can be minimized to reduce the dimension of the substrate wafer.

(c) The contact resistance of the buried bit lines is lowered to improve the performance of ROM product.

While the invention has been described by way of example and in terms of a preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of fabricating a high density flat cell mask ROM device which is subsequently to be programmed, comprising the following steps:

(a) forming a plurality of trenches in a surface of a silicon substrate at predetermined source-drain electrode areas of the silicon substrate;

(b) forming a dielectric layer on at least surfaces of the trenches;

(c) forming a first polysilicon layer on at least a surface of the dielectric layer;

(d) removing portions of the first polysilicon layer to leave respective residual portions of the first polysilicon layer in the respective trenches;

(e) etching the dielectric layer from at least the surfaces of said trenches using the first polysilicon layer as an etch stop layer;

(f) forming a second polysilicon layer on the surface of the silicon substrate, the first polysilicon layer and the dielectric layer;

(g) etching the second polysilicon layer to substantially a height of the surface of the silicon substrate to form the source-drain electrode areas;

(h) forming a gate oxide layer and then a third polysilicon layer on the surface of the silicon substrate and the source-drain electrode areas; and (i) defining the gate oxide layer and the third polysilicon layer to form gate electrodes.

2. A method according to claim 1, wherein a depth of said plurality of trenches formed in the step (a) is between 0.2 μm to 0.4 μm.

3. A method according to claim 1, wherein said dielectric layer in the step (b) is an oxide layer.

4. A method according to claim 3, wherein a thickness of said oxide layer is between 500 to 800 Å.

5. A method according to claim 1, wherein said first polysilicon layer is removed in the step (d) by etching back of said first polysilicon layer.

* * * * *